United States Patent
Kihara et al.

(10) Patent No.: US 10,298,332 B2
(45) Date of Patent: May 21, 2019

(54) METHOD OF CONTROLLING SEMICONDUCTOR OPTICAL DEVICE THAT INCLUDES SEMICONDUCTOR OPTICAL AMPLIFIER

(71) Applicant: SUMITOMO ELECTRIC DEVICE INNOVATIONS, INC., Yokohama-shi (JP)

(72) Inventors: Toshiaki Kihara, Yokohama (JP); Sayuri Ichida, Yokohama (JP)

(73) Assignee: SUMITOMO ELECTRIC DEVICE INNOVATIONS, INC., Yokohama-Shi (JP)

( * ) Notice: Subject to any disclaimer, the term of this patent is extended or adjusted under 35 U.S.C. 154(b) by 0 days.

(21) Appl. No.: 15/795,740

(22) Filed: Oct. 27, 2017

(65) Prior Publication Data

US 2018/0123696 A1 May 3, 2018

(30) Foreign Application Priority Data

Oct. 27, 2016 (JP) .................. 2016-210725

(51) Int. Cl.

| | |
|---|---|
| H04B 10/50 | (2013.01) |
| H04B 10/079 | (2013.01) |
| H04B 1/036 | (2006.01) |
| H01S 3/04 | (2006.01) |
| G02F 1/01 | (2006.01) |
| H01S 3/00 | (2006.01) |
| H04B 10/564 | (2013.01) |
| H04B 10/572 | (2013.01) |

(Continued)

(52) U.S. Cl.
CPC ....... *H04B 10/5053* (2013.01); *G02F 1/0123* (2013.01); *H01S 3/0085* (2013.01); (Continued)

(58) Field of Classification Search
CPC . H04B 10/5053; H04B 10/0795; H04B 1/036
See application file for complete search history.

(56) References Cited

U.S. PATENT DOCUMENTS

| | | | |
|---|---|---|---|
| 2003/0095736 A1* | 5/2003 | Kish, Jr. ............... | B82Y 20/00 385/14 |
| 2004/0264538 A1 | 12/2004 | Namiwaka et al. | |

(Continued)

FOREIGN PATENT DOCUMENTS

| | | |
|---|---|---|
| JP | H11-183857 A | 7/1999 |
| JP | 2005-019820 A | 1/2005 |

(Continued)

*Primary Examiner* — Dzung D Tran
(74) *Attorney, Agent, or Firm* — Baker Botts L.L.P.; Michael A. Sartori

(57) ABSTRACT

A method of controlling a semiconductor element that includes a semiconductor laser diode (LD), a semiconductor modulator, and a semiconductor optical amplifier (SOA) is disclosed. The LD generates CW light supplied with the first bias current. The semiconductor modulator generates a modulated light by modulating the CW light supplied with a driving signal. The SOA generates an optical signal by amplifying the modulated light supplied with the second bias current. The method first sets the second bias current in a region where the output power of the optical signal shows negative dependence of the second bias current. Then, a temperature of the semiconductor element, the first bias current, and the driving signal are adjusted such that the optical signal shows performance in respective preset ranges.

6 Claims, 10 Drawing Sheets

(51) Int. Cl.
*H01S 5/0683* (2006.01)
*H01S 5/024* (2006.01)
*H01S 5/026* (2006.01)
*H01S 5/0625* (2006.01)

(52) U.S. Cl.
CPC ............ *H01S 3/04* (2013.01); *H01S 5/06832* (2013.01); *H04B 1/036* (2013.01); *H04B 10/0795* (2013.01); *H04B 10/564* (2013.01); *H04B 10/572* (2013.01); *H01S 5/0265* (2013.01); *H01S 5/02415* (2013.01); *H01S 5/06258* (2013.01)

(56) References Cited

U.S. PATENT DOCUMENTS

| | | | |
|---|---|---|---|
| 2005/0249509 A1* | 11/2005 | Nagarajan | B82Y 20/00 398/198 |
| 2008/0310012 A1 | 12/2008 | Tanaka et al. | |
| 2009/0080904 A1 | 3/2009 | Nakamoto | |
| 2009/0175573 A1* | 7/2009 | Kish, Jr. | G02B 6/12004 385/14 |
| 2009/0324254 A1 | 12/2009 | Nakamoto et al. | |
| 2011/0206384 A1* | 8/2011 | Zhou | H04B 10/50575 398/192 |
| 2013/0170019 A1 | 7/2013 | Teranishi | |

FOREIGN PATENT DOCUMENTS

| | | |
|---|---|---|
| JP | 2006-324801 A | 11/2006 |
| JP | 2008-120375 A | 5/2008 |
| JP | 2008-311536 A | 12/2008 |
| JP | 2009-081512 A | 4/2009 |
| JP | 2013-149949 A | 8/2013 |
| JP | 2014-168268 A | 9/2014 |
| WO | 2008/120375 A1 | 10/2008 |

* cited by examiner

METHOD OF CONTROLLING SEMICONDUCTOR OPTICAL DEVICE THAT INCLUDES SEMICONDUCTOR OPTICAL AMPLIFIER

BACKGROUND OF THE INVENTION

1. Field of the Invention

The present invention relates to a method for controlling a semiconductor element that includes a semiconductor optical amplifier.

2. Related Background Arts

A Japanese Patent Application laid open No. 2005-019820 has disclosed a semiconductor laser module that encloses a distributed feedback laser (DFB-LD) built-in an optical modulator and a semiconductor optical amplifier (SOA) within a housing. The DFB-LD and the SOA are commonly mounted on a thermo-electric cooler (TEC) like a Pertier Elements thereby controlled in temperatures thereof.

Recent optical communication system such as fiber to the home (FTTH) has implemented a semiconductor laser apparatus that usually includes a semiconductor laser diode (LD) that generates laser light and modulates the laser light, and an optical amplifier that amplifies the modulated laser light to preset amplitude. Two types of an LD are well known, one of which is called as a direct modulation type, while, the other is an indirect modulation type, where the former type generates modulated light by modulating a bias current supplied to the LD, while, the latter type integrates an LD device that generates laser light with an optical modulator that modulates the laser light. One type of the optical modulator is an electro-absorption (EA) modulator that is formed on a semiconductor substrate common to the LD. The optical amplifier is typically a type of a semiconductor optical amplifier (SOA) that amplifies light supplied with a bias current. The LD and the SOA, like the optical module disclosed in the prior art above identified are mounted on a common TEC for controlling the temperatures thereof.

Operating conditions of the LD and the SOA are determined as follows: the bias current supplied to the LD is first determined as monitoring the optical power output from the LD, currently with the determination of the bias current, a current supplied to the TEC is determined as monitoring a wavelength of the laser light. After the determination of the bias current for the LD and the current for the TEC, the bias current for the SOA is determined as monitoring the power output from the SOA such that the power is within a preset range. Thus, three currents are conventionally necessary to be determined. However, such a method becomes hard to determine three currents sometimes consistently.

SUMMARY OF THE INVENTION

An aspect of the preset invention relates to a method of controlling a transmitting optical device that outputs an optical signal and includes a semiconductor laser diode (LD), a semiconductor modulator, a semiconductor optical amplifier (SOA), and a temperature controller. The semiconductor LD generates continuous wave (CW) light responding to a first bias current. The semiconductor modulator generates modulated light by modulating the light responding to a driving signal. The SOA generates the optical signal by amplifying the modulated light depending on a second bias current. The thermo-electric cooler (TEC) that mounts the semiconductor LD, the semiconductor modulator, and the SOA thereon, controls a temperature of the semiconductor LD, the semiconductor modulator, and the SOA provided with a driving current. The method includes steps of: first adjusting the second bias current supplied to the SOA depending on a waveform of the optical signal after a transmission of a predetermined distance; and, after adjusting the second bias current, adjusting the driving current for the TEC such that the optical signal has a target wavelength, adjusting the first bias current such that the optical signal shows target power, and adjusting the driving signal such that the optical signal shows a target extinction ration, a target cross point, and a target pulse mask margin (PMM). A feature of the method of the invention is that the second bias current is adjusted in a region where the optical signal in power thereof shows a negative relation against the second bias current.

Another aspect of the present invention relates to a transmitting optical device that includes a semiconductor laser diode (LD), a semiconductor modulator, and a semiconductor optical amplifier (SOA). The LD generates continuous wave (CW) light supplied with a first bias current. The semiconductor modulator generates a modulated light by modulating the CW light based on a driving signal supplied thereto. The SOA generates an amplified light by optically amplifying the modulated light supplied with a second bias current. A feature of the transmitting optical device of the present invention is that the second bias current for the SOA has magnitude in a region where the amplified light in power thereof shows negative relation with respect to the second bias current.

BRIEF DESCRIPTION OF THE DRAWINGS

The invention will now be described by way of example only with reference to the accompanying drawings in which.

DESCRIPTION OF EMBODIMENT

Next, preferred embodiment according to the present invention will be described as referring to drawings. In the description of the drawings, numerals or symbols same with or similar to each other will refer to elements same with or similar to each other without duplicating explanations.

Figure 1:
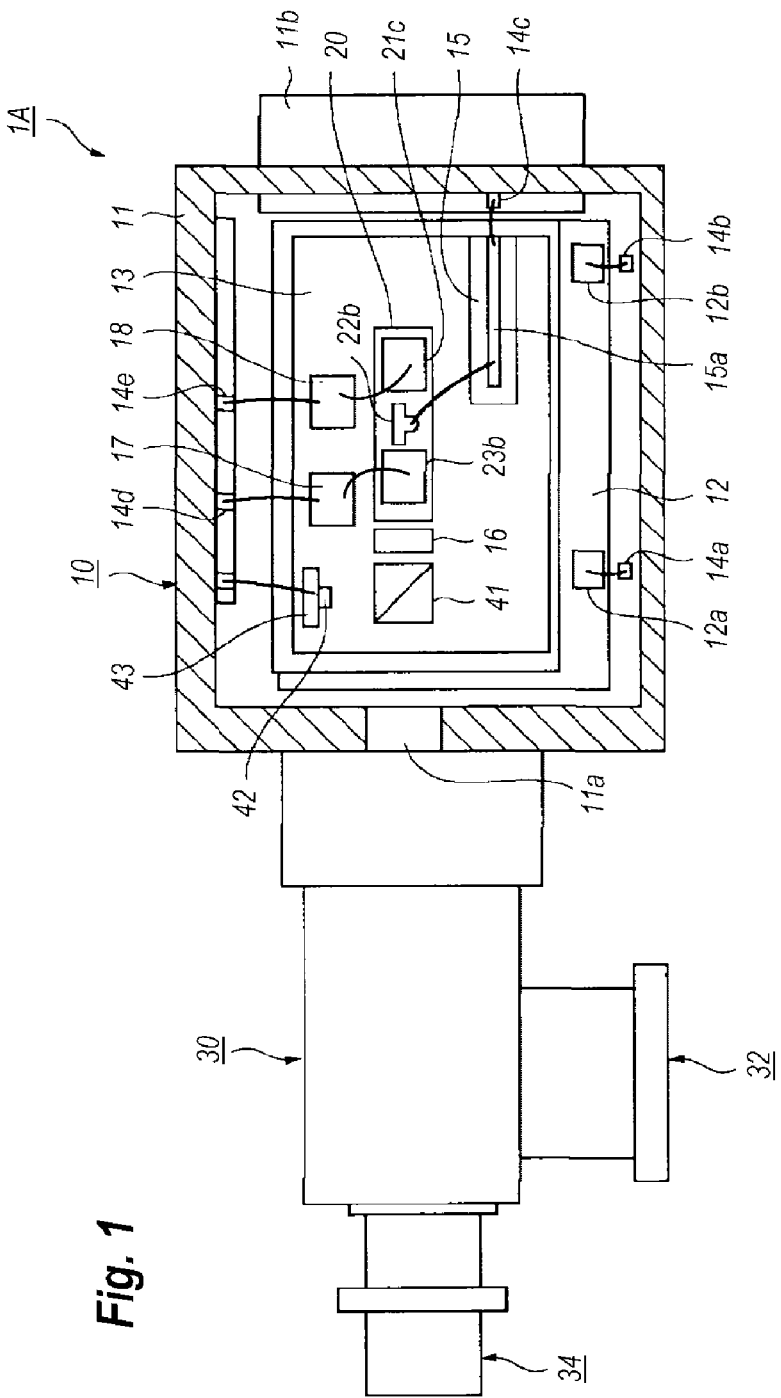
FIG. 1 is a plan view of an optical sub-assembly (OSA) according to the present invention.

FIG. 1 is a plan view of an optical sub-assembly (OSA) 1A according to the present invention. FIG. 1 shows an optical transmitting device 10 by a plan view with a partial cross section to show an inside of the optical transmitting device 10, where the optical transmitting device 10 is a subject for determining operating conditions thereof of the present invention.

The OSA 1A, which may be a type of, what is called as a bi-directional optical sub-assembly (BOSA), includes, in addition to the optical transmitting device 10, a wavelength division multiplexing (WDM) unit 30, an optical receiving device, and a coupling unit 34. Exactly, FIG. 1 shows a port 32 to which the optical receiving device is to be assembled. The WDM unit 30, which may have a cylindrical shape, installs a wavelength selective filter (WSF) therein. The optical transmitting device 10 is attached to one end of the cylindrical WDM unit 30 such that an optical signal output from the optical device 10 enters within the WDM unit 30. The optical signal, passing the WSF in the WDM unit 30, is externally output from the other end of the WDM unit 30. The receiving optical module, which is attached to the port 32 provided in a side of the WDM unit 30, receives another optical signal entering the coupling unit 34 and reflected by the WSF in the WDM unit 30. The receiving optical module may provide a CAN package, or sometimes called as a co-axial package, installs a light-receiving device for converting an optical signal into an electrical signal, which is typically a semiconductor photodiode (PD). The transmission speed of the receiving optical signal, or the transmitting optical signal, is typically 10 Gbps. The WDM unit 30 may further install another WSF, for instance, a band-passing filter operable for a signal channel with a width of 100 GHz that eliminates noises contained in the receiving optical signal. The coupling unit 34, which has also cylindrical shape and is fixed to the other end of WDM unit 30 opposite to the side to which the optical transmitting device 10 is attached, receives an optical ferrule secured in a tip of an external optical fiber to establish an optical communication therebetween.

The optical transmitting device 10 may generate and transmit the transmitting optical signal with a speed of 10 Gbps. The optical transmitting device 10 has a box-shaped housing 11, a thermo-electric cooler (TEC) 12, carriers, 13 and 43, a substrate 15, a lens 16, capacitors, 17 and 18, a semiconductor element 20, a beam splitter (BS) 41, and a light-receiving device 42.

Figure 2:
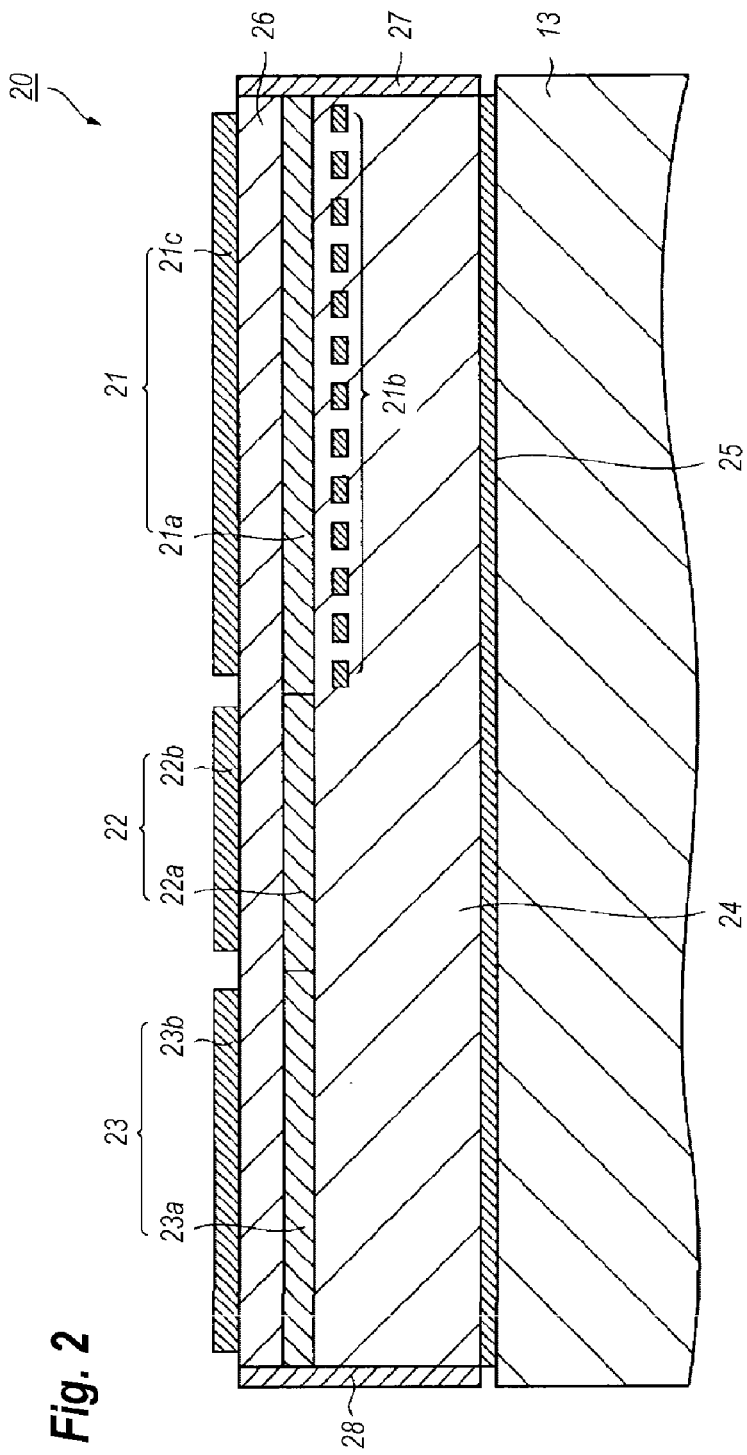
FIG. 2 shows a cross section of a semiconductor element along an optical axis thereof.

FIG. 2 shows a cross section of the semiconductor element 20 along an optical axis thereof. The semiconductor element 20 of the present embodiment provides a region of a semiconductor laser diode (LD) 21, a region of a semiconductor modulator 22, which is a type of an electro-absorption (EA) modulator and accordingly called as the EA modulator region, and a semiconductor optical amplifier (SOA) 23 optically coupled with the EA modulator region 22. These elements of the LD region 21, the EA modulator region 22, and the SOA 23 are monolithically integrated on a common semiconductor substrate 24. The semiconductor substrate 24 in a back surface thereof provides an electrode 25 that is common to the LD region 21, the EA modulator region 22, and the SOA 23, where the semiconductor element 20 is mounted on the carrier 13 via electrically conductive resin applied between the semiconductor element 20 and the carrier 13.

The LD region 21 generates an optical signal of continuous wave (CW) light, supplied with the bias current. The CW light is modulated in the EA modulator region 22 supplied with a driving signal thereto. The LD region 21 and the EA modulator region 22 are formed on the semiconductor substrate 24 common to the both regions, 21 and 22, and adjacent to each other. The LD region 21 includes an active layer 21a, an upper cladding layer 26 on the active layer 21a, and an electrode 21c providing on the upper cladding layer 26. The bias current, namely, the first bias current $I_{OP}$, is supplied to the electrode 21c to generate the CW light. The LD region 21 is a type of, what is called as the distributed feedback laser diode (DFB-LD), providing an optical grating 21b between the active layer 21a and the semiconductor substrate 24. The wavelength selecting function of the optical grating 21b in the LD region 21 may uniquely determine the wavelength of the CW light output from the LD region 21. The LD region 21 provides a reflection film 27 in the facet opposite to a side where the EA modulator region 22 is provided.

The EA modulator region 22, which is sandwiched by the LD region 21 and the SOA 23, may modulate the CW light generated in the LD region 21 to form a modulated optical signal. The EA modulator region 22 includes an optical absorbing layer 22a on the semiconductor substrate 24, a cladding layer 26 provided on the optical absorbing layer 22a, and an electrode 22b provided on the cladding layer 26. Depending on the driving signal supplied to the electrode 22b, the EA modulator region 22 may absorb a portion of the CW light entering the EA modulator region 22. Thus, the electrode 22b may receive the driving signal of a type of a voltage signal.

The SOA 23, which provides an active layer 23a on the semiconductor substrate 24, a cladding layer 26 on the active layer 23a, and an electrode 23b on the cladding layer 26, may optically amplify the optical signal output from the EA modulator region 22 by supplying a bias current, which is the second bias current $I_{SOA}$, to the electrode 23b. Thus, the semiconductor element 20 may generate the optical signal with enhanced power. The SOA 23 may amplify an optical signal whose wavelength is within a range of 1250 to 1600 nm used in the PON system. The SOA 23 also provides an anti-reflection coating in a facet opposite to the EA modulator region 22.

The semiconductor substrate 24 may be made of n-type indium phosphide (InP), while, the active layer 23a may be a type of multiple quantum well structure comprised of well layers made of quaternary material of InGaAsP and barrier layers made of also InGaAsP but compositions thereof are different from those of the well layers. The cladding layer 26 may be made of p-type InP. In an alternative, the active layer 23a may be a bulk material of InGaAsP.

In the present embodiment, the LD region 21, the EA modulator region 22, and the SOA 23 are monolithically integrated on the semiconductor substrate 24. However, the LD region 21, the EA modulator region and the SOA 23 may be independently or discretely prepared. Also, the semiconductor element 20 of the present embodiment provides the EA modulator region between the LD region 21 and the SOA 23; but, the semiconductor element 20 may remove the EA modulator region 22. That is, the LD region 21 may be directly driven by a modulation signal suppled to the electrode 21c, which is often called as the direct driving configuration.

Referring to FIG. 1 again, the TEC 12, which is disposed on a bottom of the housing 11, may absorb heat from components mounted thereon depending on a driving current supplied thereto, and exhausts thus absorbed heat outside of the housing 11. Components on the TEC 12 are the semiconductor element 20 including the LD region 21, the EA modulator region, and the SOA 23; accordingly, the TEC 12 may control the temperature of the LD region 21, the EA modulator region, and the SOA 23. Thus, the CW light output from the LD region 21 in the wavelength thereof may be stabilized at the designed wavelength. The TEC 12 may include Peltier elements. Electrodes, 12a and 12b, provided on a bottom plate of the TEC 12 are wire-bonded to terminals, 14a and 14b, formed on the feedthrough of the housing 11. Provided with the bias current from the outside, the TEC 12 may control the temperature of the semiconductor element 20. The TEC 12 mounts the carrier 13 thereon, where the carrier 13 may have a rectangular slab shape and having good thermal conductivity to conduct heat generated by the semiconductor element 20.

The substrate 15 is fixed on the carrier 13, where the substrate 15 has a slender slab shape extending toward the rear wall of the housing 11. The substrate 15 provides a transmission line 15a on a top surface and a ground pattern on a back surface thereof so as to form a micro-strip line. A bonding wire may electrically connect the transmission line 15a in one end thereof to the electrode 22b on the semiconductor element 20, while, another bonding wire may electrically connect the transmission line 15a in another end thereof to a terminal 14c provided on the feedthrough 11b in the rear wall of the housing 11. The substrate 15 may provide the driving signal that is provided to the terminal 14c to the electrode 22b from the outside of the optical transmitting device 10.

The lens 16, which optically couples with the facet of the semiconductor element 20, is a type of convex lens and collimates the optical signal generated by the semiconductor element 20. The collimated optical signal is split by the BS 41 into an output beam and a monitored beam, where the output beam is output through the window 11a in the front wall of the housing 11 to the WDM unit 30; while, the monitored beam is received by a monitoring photodiode (mPD) 42 mounted on the PD carrier 43. The lens 16 is fixed on the carrier 13. The mPD 42 may be a type of PIN photodiode or avalanche photodiode.

The capacitor 17, which is a type of die-capacitor and also fixed on the carrier 13, has a top electrode from which two bonding wires extract, one of which is connected with the electrode 23b of the semiconductor element 20, while, the other is connected to the terminal 14d on the feedthrough. A bottom electrode of the capacitor 17 is grounded through the carrier 13. The bias current externally provided is supplied to the electrode 23b through the terminal 14d and the capacitor 17. Thus, the capacitor 17 may be operable as a bypassing capacitor to eliminate noises in high frequency components.

Another capacitor 18, which is also a type of die-capacitor and fixed on the carrier 13, extracts two bonding wires from a top electrode thereof, one of which is connected with the electrode 21c of the semiconductor element 20, while, the other is connected with the terminal 14e provided on the feedthrough. The capacitor 18 in the bottom electrode thereof is directly grounded through the carrier 13. The bias current externally provided is supplied to the electrode 21c through the terminal 14e and the capacitor 18. Thus, the capacitor 18 may be also operable as a bypassing capacitor to eliminate noises in high frequency components.

Figure 3:
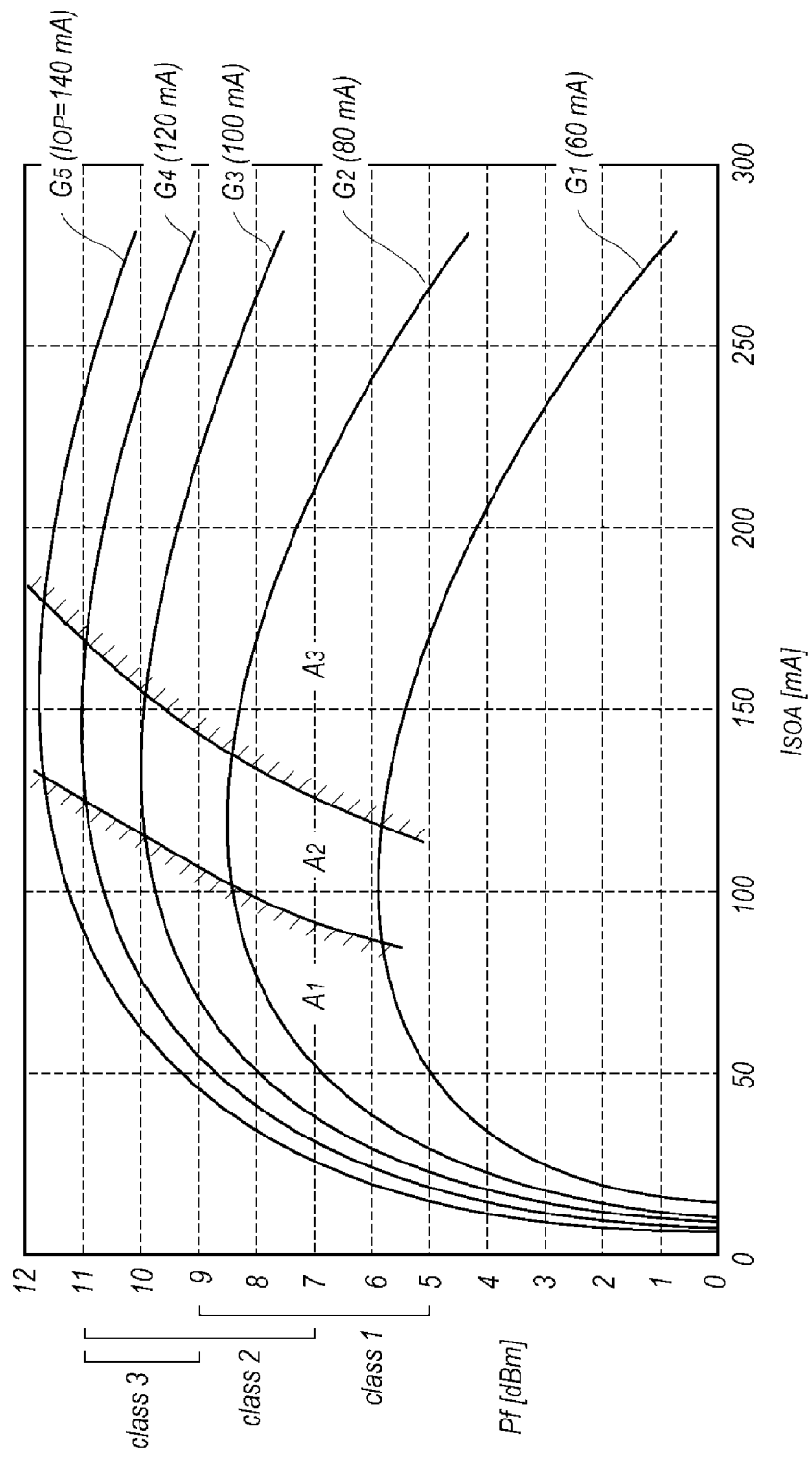
FIG. 3 exemplarily shows relations between the bias current of the SOA against the optical power output from the SOA.

Next, details of the SOA 23, in particular, output performance of the SOA 23 will be described. FIG. 3 exemplarily shows relations between a bias current $I_{SOA}$ and the optical output power $P_f$ of an SOA. FIG. 3 in a vertical axis thereof shows average output power $P_f$ in the unit of dBm, while, the horizontal axis shows the bias current $I_{SOA}$ for the SOA in the unit of mA. The vertical axis also indicates ranges of classes defined in the PON system, where the classes depend on how many branches are set in the transmission path. Behaviors, $G_1$ to $G_5$, correspond to the bias currents $I_{OP}$ provided to electrode 21c in the LD region 21, which are 60, 80, 100, 120, and 140 mA, respectively. As FIG. 3 indicates, the output optical power of the SOA depends on the bias current $I_{OP}$ for the LD region 21, specifically, a larger bias current $I_{OP}$ results in greater optical power. Also, the operation of the SOA is divided in three regions, where the first region $A_1$ shows positive dependence of the output power $P_f$ against the bias current $I_{SOA}$, the second region $A_2$ saturates the output power $P_f$, and the third region $A_3$ shows negative dependence of the output power $P_f$ against the bias current $I_{SOA}$.

The second region $A_2$ does not always keep the output power $P_f$ in saturated power within a measurement error. Accordingly, the second region is assumed to be within a range from a point where the output power $P_f$ is lowered by 0.1 dB measured from the maximum output power to another point where the output power $P_f$ is also lowered by 0.1 dB measured from the maximum output power. A reason why the output power $P_f$ of the SOA 23 decreases as increasing the bias current in the third region $A_3$ is that a larger bias current $I_{OSA}$ inevitably generates heat to increase a temperature of the SOA 23, which decreases the efficiency of the SOA 23, that is, the output power $P_f$ decreases as the increase of the bias current $I_{SOA}$.

An SOA is preferably driven so as to effectively amplify an optical signal entering therein. That is, a larger output power is obtained by a smaller bias current $I_{SOA}$. Thus, an SOA is usually driven in the first region $A_1$. The second and third regions, $A_2$ and $A_3$, have been preferably avoided.

However, an SOA driven in the regions, $A_2$ and $A_3$, is investigated in output waveforms thereof; specifically, optical signals just output from the SOA, which will be called as at Back to Back (BtoB) and those after 40 km transmission are investigated in waveforms thereof and in transmission penalties determined through bit-error rates (BERs) under conditions of the bias current $I_{OP}$ for the LD region 21 of 80 mA and the driving signal for the EA modulator region 22 of 1.0 $V_{PP}$, and a temperature of the semiconductor element 20 of 44.3° C.

Figure 4:
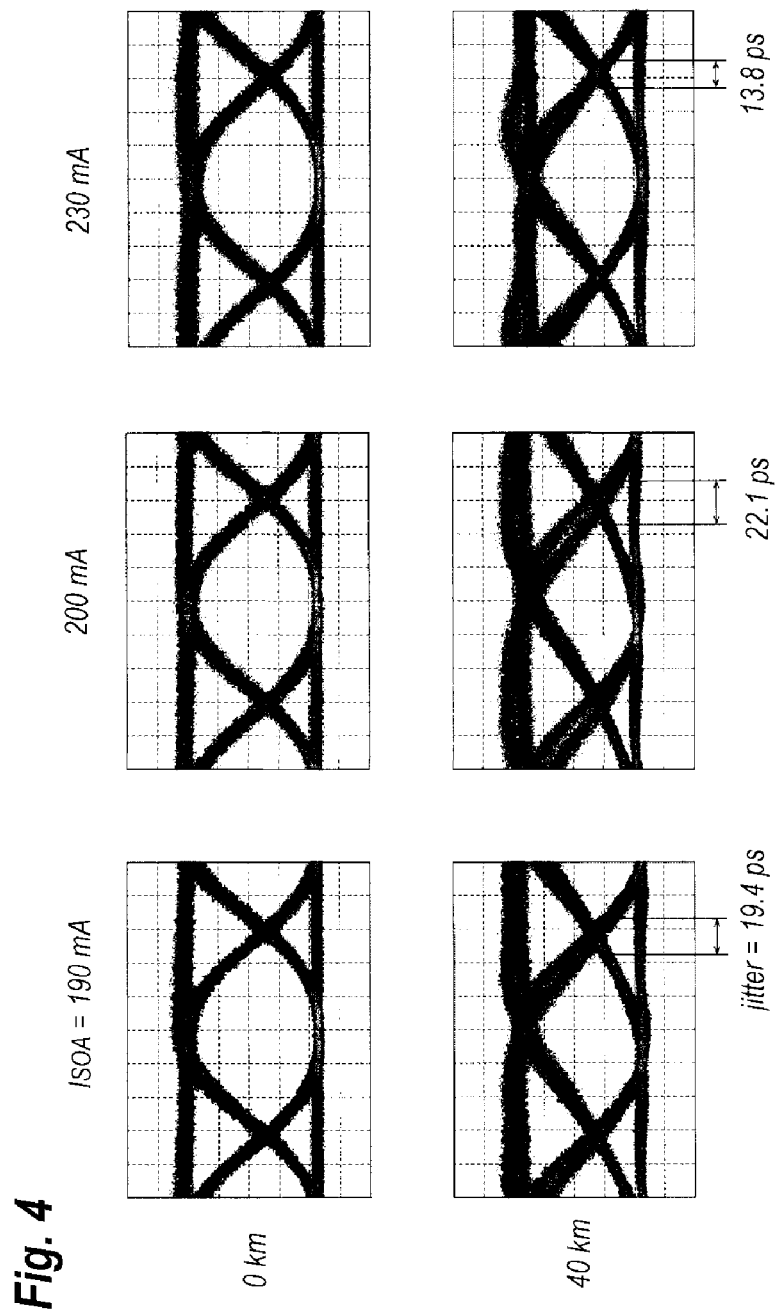
FIG. 4 compares eye-diagrams of optical signals just output from the SOA, (BtoB) with those after 40 km transmission when the bias current for the SOA are 190 mA, 200 mA, and 230 mA, respectively.
Figure 5:
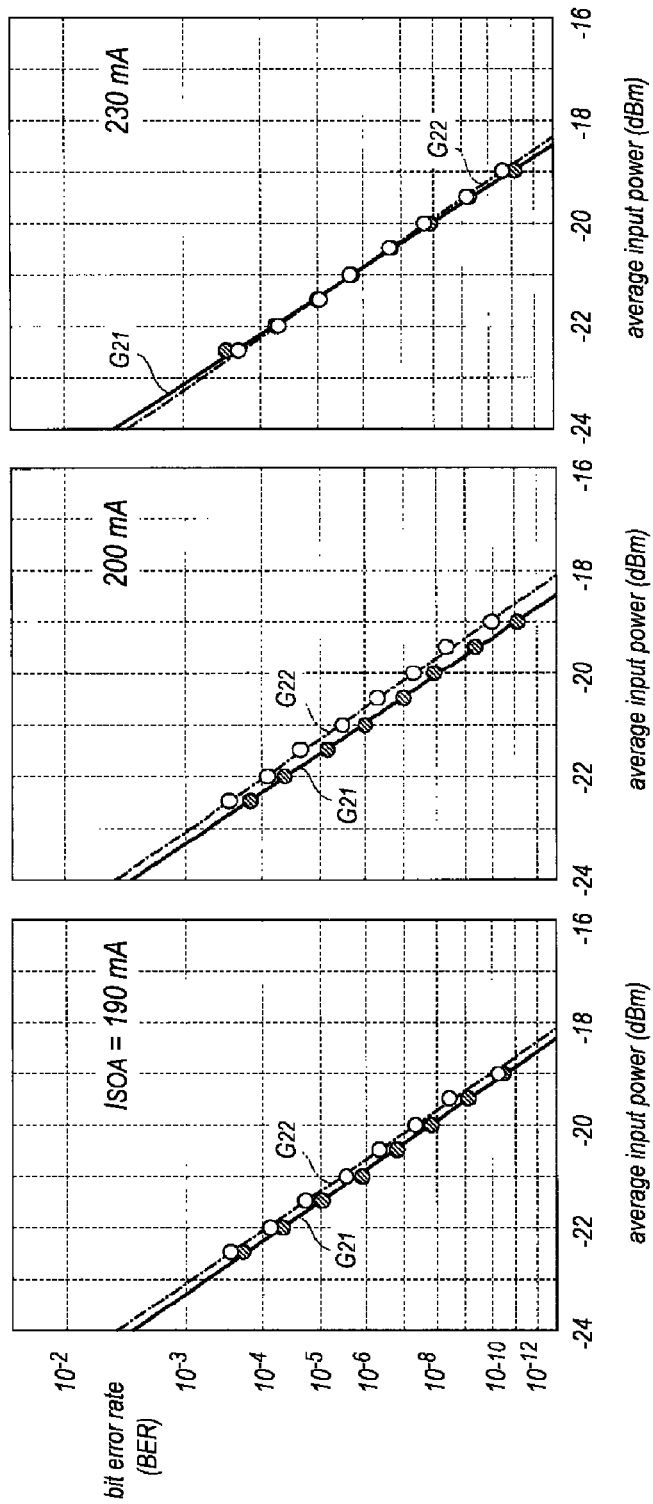
FIG. 5 compares the bit-error rate (BER) of the optical signals, namely, transmission penalties, at BtoB with those after 40 km transmission when the bias currents $I_{SOA}$ for the SOA are 190 mA, 200 mA, and 230 mA, respectively

FIG. 4 compares the eye-diagrams of an optical signals just output from the SOA, namely, at BtoB, with those after 40 km transmission for the bias currents $I_{SOA}$ of 190 mA, 200 mA, and 230 mA, respectively; and FIG. 5 compares the BERs of the optical signals, namely, transmission penalties, at BtoB with those after 40 km transmission when the bias currents $I_{SOA}$ for the SOA 23 are 190 mA, 200 mA, and 230 mA, respectively; where behaviors $G_{21}$ correspond to the BERs at BtoB, while, behaviors $G_{22}$ show the BERs for the 40 km transmission. In FIG. 5, the horizontal axis denotes average receiving power, while, the vertical axis corresponds to the BER. The optical signal is detected by a PIN-PD with optical sensitivity of −23 dBm. When an avalanche PD (APD) is used as the optical detector, the optical sensitivity of the APD usually show around −30 dBm, then, the BERs in FIG. 5 may further enhanced.

As FIG. 4 shows, the waveforms of the optical signals at BtoB are good independent on the bias current $I_{SOA}$; while, those after 40 km transmission are degraded. However, jitters observed in the optical signal after 40 km transmission is suppressed to 19.4 ps, 22.1 ps, and 13.8 ps, respectively.

In particular, the greatest bias current of $I_{SOA}$, namely 230 mA results in the minimum jitter of 13.8 ps.

Referring to FIG. 5, the BERs after the 40 km transmission are not degraded independent of the bias current $I_{SOA}$. In particular, the BERs for the bias current $I_{SOA}$ of 230 mA become substantially comparable to each other at BtoB and after 40 km transmission. The transmission penalties for those BERs in the bias currents of 190 to 230 mA become 0.21 dB, 0.26 dB, and −013 dB, respectively, where a transmission penalty is given by a difference of the average input power between at BtoB and 40 km transmission.

Magnitudes of the bias currents, 190, 200, and 230 mA, by which the waveforms after 40 km transmission become satisfactory, are in the third region $A_3$ in FIG. 3. A reason why an SOA supplied with a bias current $I_{SOA}$ in the third region $A_3$ suppresses or not degrade the transmission performance is that an SOA increases a negative chirp in the SOA, accordingly, an optical signal output from the SOA superposes a negative chirp thereon which may compensate a positive chirp caused in an optical fiber.

Thus, the SOA 23 may be driven by the bias current $I_{SOA}$ in the third region $A_3$. Referring to FIG. 3, FIG. 3 also indicates the class 1 to class 3 defined in the PON system. When the system is for the class 1, the bias current $I_{OP}$ for the LD region 21 is, for instance, preferably set to be 80 mA and the bias current $I_{SOA}$ may be preferably set around 200 mA. When the system is for the class 2, the bias currents, $I_{OP}$ and $I_{SOA}$, are set to be, for instance, 100 mA and 240 mA, respectively; and 120 mA and 250 mA are preferable selected for the bias currents, $I_{OP}$ and $I_{SOA}$, for the class 3.

Next, a method of controlling the optical transmitting device 10 will be described as referring to tables 1 and 2 below, where the table 1 lists initial values, while, table 2 lists those after the adjustment of the bias current $I_{SOA}$ according to the present embodiment. In tables, symbols $P_f$, $T_{LD}$, $I_{OP}$, $I_{SOA}$, $V_0$, and $V_{PP}$ are the output power of the semiconductor element 20, a temperature of the semiconductor element 20, the bias current supplied to the LD region 21, the bias current supplied to the SOA 23, an offset level of the driving signal supplied to the EA modulator region 22, and amplitude of the driving signal supplied to the EA modulator region 22.

| Class | First | Second | Third |
|---|---|---|---|
| $T_{LD}$ | 42° C. | 40° C. | 38° C. |
| $I_{OP}$ | 80 mA | 110 mA | 120 mA |
| $I_{SOA}$ | 200 mA | 260 mA | 260 mA |
| $V_O$ | −0.1 V | −0.1 V | −0.1 V |
| $V_{PP}$ | 1.0 V | 1.3 V | 1.4 V |
| $P_f$ | 7.5 ± 0.5 dBm | 9.5 ± 0.5 dBm | 10.0 ± 0.5 dBm |
| $T_{LD}$ | 35~45° C. | 35~45° C. | 35~45° C. |
| $I_{OP}$ | 80 ± 15 mA | 110 ± 20 mA | 120 ± 20 mA |
| $I_{SOA}$ | 190~230 mA | 250~270 mA | 250~270 mA |
| $V_O$ | −0.1 V | −0.1 V | −0.1 V |
| $V_{PP}$ | 0.95~1.20 V | 1.20~1.50 V | 1.30~1.60 V |

Figure 6:
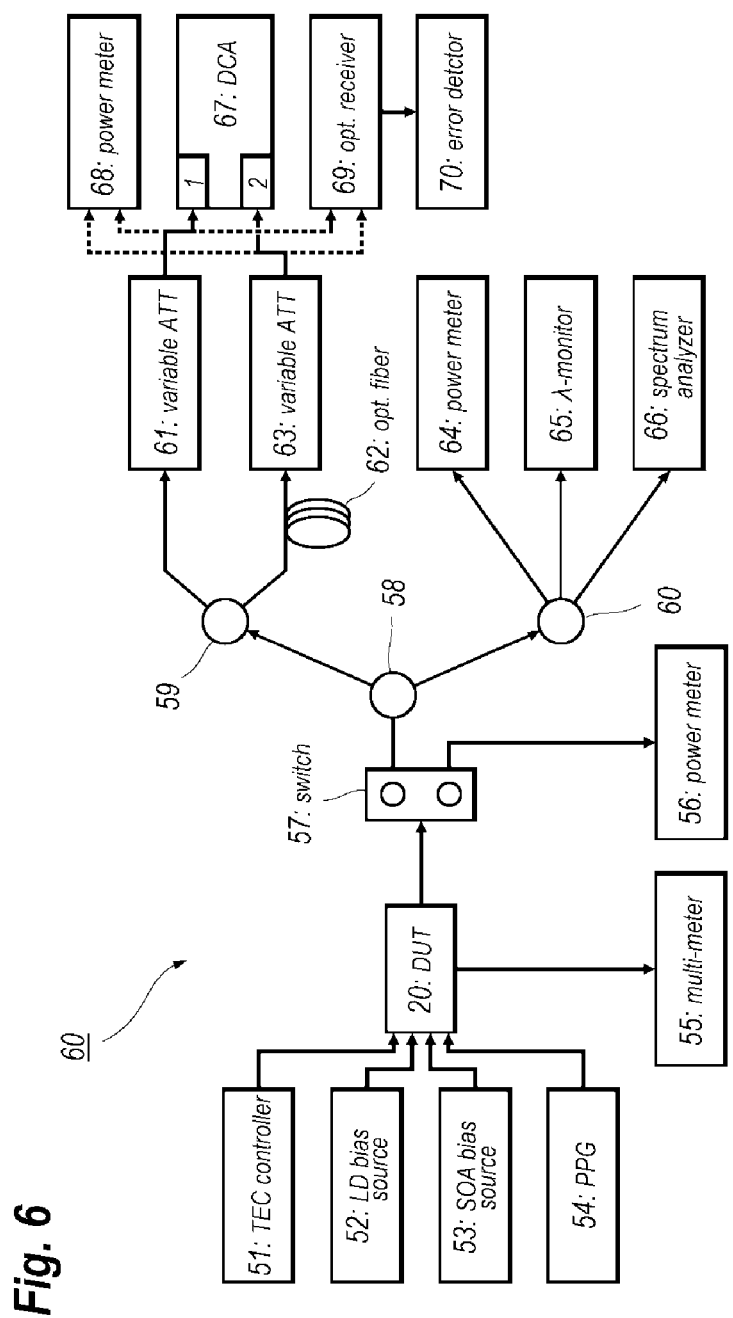
FIG. 6 shows a setup for determining operating conditions of a semiconductor laser diode and a semiconductor optical amplifier.

FIG. 6 schematically illustrates a setup 50 for evaluating the bias current $I_{SOA}$ and the like of the semiconductor element 20. The setup 50 provides a TEC controller 51, an LD bias source 52, an SOA bias source 53, a pulse pattern generator (PPG) 54, and a multi-meter 55.

The TEC controller 51, which is connected with the terminals, 14a and 14b, shown in FIG. 1, supplies the driving current to the terminals, 14a and 14b. The LD bias source 52 supplies the bias current $I_{OP}$ to the LD region 21 as adjusting magnitude thereof. The LD bias source 52 is connected with the terminal 14e shown in FIG. 1 to supply the bias current $I_{OP}$ to the LD region 21.

The SOA bias source 53 supplies the bias current $I_{SOA}$ to the SOA 23 as adjusting magnitude thereof. The SOA bias source 53 is connected with the terminal 14d shown in FIG. 1, and supplies the bias current SOA thereto. The PPG 54 supplies the driving signal to the EA modulator region 22 as adjusting an offset level and amplitude thereof. The PPG 54 is connected with the terminal 14c shown in FIG. 1.

The setup 50 may further provide an optical switch 57, optical couplers, 58 to 60, variable optical attenuators (ATTs), 61 and 63, an optical fiber 62 with a length of 40 km, two optical power meters, 63 and 68, a wavelength monitor 65, an optical spectrum analyzer 66, a digital communication analyzer (DCA) 67, an optical receiver 69, and an error detector 70.

The optical switch 57, which optical couples with the semiconductor element 20, receives the optical signal output therefrom. The optical switch 57 couples with the optical coupler 58 in one of the outputs and with the power meter 56 in another output. The optical coupler 58 splits the optical signal coming from the optical switch 57 into two portions, one of the portions couples with the second optical coupler 59, while, the other portion couples with the third optical coupler 60. The second optical coupler 59 further spits the optical signal combing from the first optical coupler 58 into two portions, one of which directly enters the first variable optical attenuator (ATT) 61 while the other also enters another variable optical ATT 63 but after propagating within an optical fiber 62. The third optical coupler 60 splits the optical signal coming from the first optical coupler 58 into three portions, where the first portion enters the power meter 64, the second one enters the wavelength monitor 65, and the third one enters the optical spectrum analyzer 66.

The DCA 67, which provides two input ports, 1 and 2, compares two optical signals each entering these two ports and evaluates jitters attributed to respective optical signals. One of the two ports couples with the variable ATT 61, while, the other of the ports couples with the other variable ATT 63. The power meter 68, which may monitor average power of the optical signal, temporarily couples with the two variable ATTs, 61 and 63. The optical receiver 69, which may convert an optical signal into an electrical signal, also temporarily couples with two variable ATTs, 61 and 63. The converted electrical signal is transferred to the error detector 70 thereby the BER, the transmission penalty, and the like may be evaluated.

Figure 7:
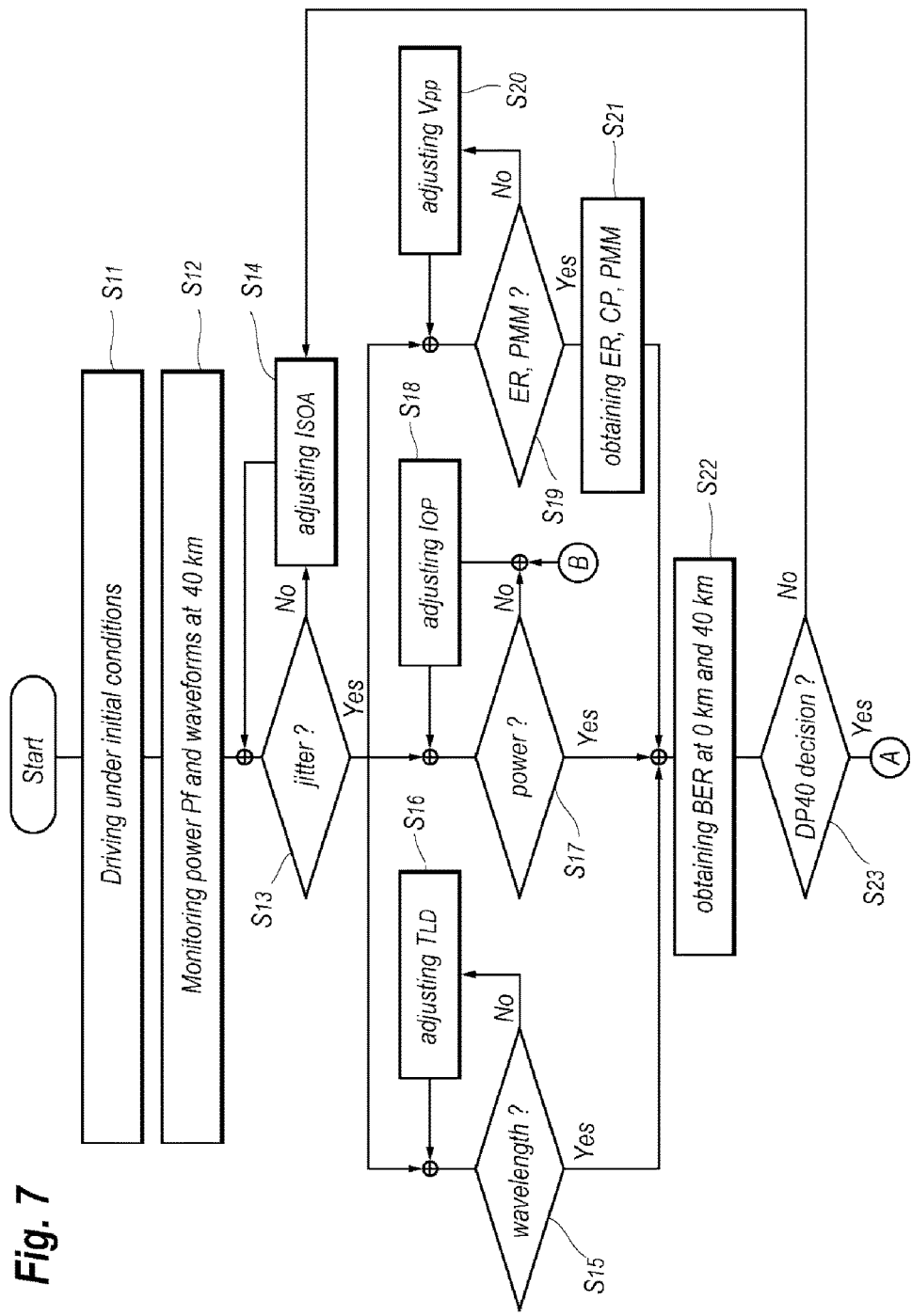
FIG. 7 shows a flow chart of a method for determining the operating conditions of the LD and the SOA.
Figure 8:
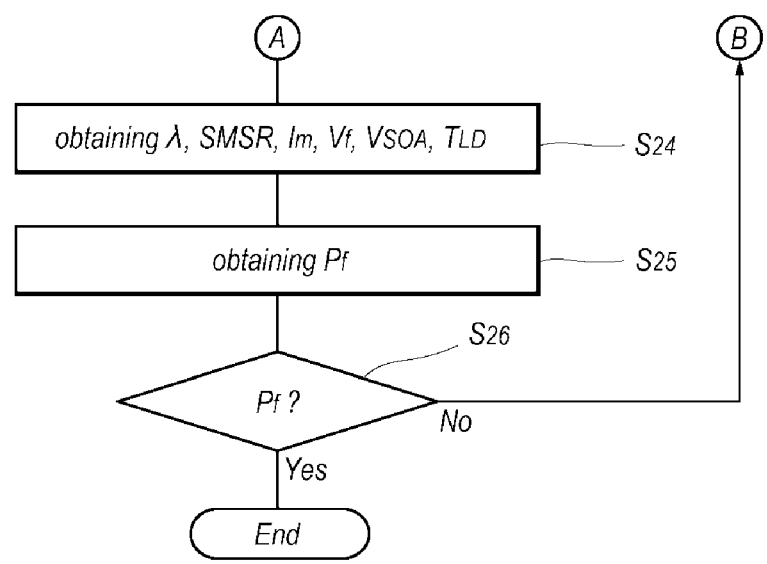
FIG. 8 shows a flow chart of a method for determining the operating conditions of the LD and the SOA.

FIGS. 7 and 8 show a flowchart for controlling the optical transmitting device 10, or the semiconductor element 20, according to embodiment of the present invention. In FIG. 7, steps $S_{12}$ to $S_{14}$ are an example of the second process, steps $S_{15}$ to $S_{20}$ are an example of the third process, and step $S_{23}$ is an example of the fourth process each according to the present embodiment.

First, the process at step $S_{11}$ activates the semiconductor element 20 to generate a modulated optical signal by setting the first bias current $I_{OP}$ for the LD region 21, the driving signal for the EA modulator region 22, the second bias current $I_{SOA}$ for the SOA region 23, and the driving current for the TEC 12 each determined beforehand as the initial conditions. Then, the LD region 21, the EA modulator region 22, and the SOA 23 may operate such that the LD region 21 generates CW light, the EA modulator region 22 modulates the CW light, and the SOA 23 amplifiers the modulated light. Thereafter, coupling the semiconductor element 20 under test with the optical coupler 58 by the optical switch 57, the output power $P_f$, the wavelength λ, and the waveforms, typically the jitter at BtoB and after 40 km transmission, of the modulated light are evaluated by the power meter 64, the wavelength monitor 65, and the DCA 67, respectively, at step $S_{12}$.

Then, the jitters at BtoB and after 40 km transmission are checked at step $S_{13}$. When the jitters are out of a preset range, which corresponds to "No" in FIG. 7, the bias current $I_{SOA}$ is adjusted at step $S_{14}$. Steps, $S_{13}$ and $S_{14}$, are iterated until the jitters become within the preset range. During the evaluation of the jitters, the DCA in the oscilloscope mode may accelerate the determination of the magnitude of the bias current $I_{SOA}$. The bias current $I_{SOA}$ thus determined falls within the region $A_3$ indicated in FIG. 3.

The region $A_3$ for the bias current $I_{SOA}$ has widths exceeding 100 mA with respect to the respective bias currents $I_{OP}$ for the LD region 21. However, an adjustment of the bias current $I_{SOA}$ within 30 mA may empirically suppress the jitters and bring a satisfactory transmission penalty. Also, the preset range of the jitters targeted in step $S_{13}$ is, for instance, 24 ps. However, depending on the chirping characteristic in the EA modulator region 22 and the SOA 23, the jitters sometimes exceed this preset range. Under such a situation, the target jitter may be changed to be shorter than 25 ps. Thus, the target jitter is optional and should be determined depending on the system.

When the jitter becomes within the preset range at steps, $S_{13}$ and $S_{14}$, subsequent evaluations may be concurrently carried out at steps, $S_{15}$, $S_{17}$, and $S_{19}$. Step $S_{15}$ checks whether the wavelength of the modulated light is within a range of ±0.05 nm around the target wavelength by using the wavelength monitor 65. When the checked wavelength is out of the range, which corresponds to No in step $S_{15}$, the driving current for the TEC 12 is adjusted to vary the temperature of the semiconductor element 20 under test at step $S_{16}$. Steps, $S_{15}$ and $S_{16}$, may be iterated until the monitored wavelength enters within the preset range around the target wavelength. The wavelength of the optical signal output from the semiconductor element 20 generally shows a linear dependence of the temperature thereof with a temperature co-efficient of 0.12 nm/° C. Adjustment of the temperature within ±3° C. usually sets the wavelength of the semiconductor element 20 within the preset range around the target wavelength.

Step $S_{17}$ checks the average power $P_f$ of the modulated beam by the power meter 64. Ranges of the average power $P_f$ depends on the classes described above. For instance, the first class sets the power range of +5 to +9 dBm, the second class sets the power range of +7 to +11 dBm, and the third class sets the power range to be +9 to +11 dBm. When the monitored power is out of the power range, which corresponds to "No" at step $S_{17}$, the bias current $I_{OP}$ supplied to the LD region 21 is adjusted at step $S_{18}$. Steps, $S_{17}$ and $S_{18}$ are iterated until the monitored power falls within the target power range. Because two optical couplers, 58 and 60, interpose between the semiconductor element 20 and the power meter 64, the monitored power $P_f$ should take optical losses caused in these optical couples, 58 and 60, into account, where the optical losses become totally about −13 dBm in the present embodiment. The LD region 21 generally shows a linear dependence of the optical power against the bias current $I_{OP}$, which is often called as the I-F characteristic of an LD. The LD of the present embodiment shows a slope efficiency about 0.05 dBm/mA, then, the bias current $I_{OP}$ may be varied around the initially set value in a range of ±15 mA.

The wavelength of the CW light generate in the LD region 21 depends on the bias current $I_{OP}$ with a temperature co-efficient about 6.5 μm/mA, which means that, adjusting the bias current $I_{OP}$ within the range ±15 mA, the wavelength of the CW light varies within about ±0.1 nm. Accordingly, after performing step $S_{18}$; steps, $S_{15}$ and $S_{16}$, may be carried out again depending on the adjusted bias current $I_{OP}$. Also, when the temperature of the LD region 21 varies, the output power of the CW light varies depending on the temperature with a temperature co-efficient about −0.37 dBm/° C. Accordingly, steps, $S_{17}$ and $S_{18}$, may be carried out again depending on the variation of the temperature of the semiconductor element 20. That is, the method of the embodiment may iterate steps, $S_{15}$ and $S_{16}$, and steps, $S_{17}$ and $S_{18}$. In the embodiment thus described, step $S_{15}$ preferably defines the wavelength with an enough preciseness, for instance ±0.05 nm, while, step $S_{17}$ may roughly determine the target power, for instance ±0.5 dBm.

Step $S_{19}$ evaluates the extinction ratio (ER), the cross point (CP), and the pulse mask margin (PMM) of the optical signal just output from the semiconductor element 20, namely at BtoB. When the ER and the PMM are out of range, the driving signal $V_{PP}$ in amplitude thereof is adjusted at step $S_{20}$, and step $S_{19}$ is carried out again. The variable range of the amplitude $V_{PP}$ is about ±0.2 V. Thus, the amplitude $V_{PP}$ may be determined such that the ER and the PMM become within the target range by iterating steps, $S_{19}$ and $S_{20}$. The process thus described concurrently carries out steps, $S_{15}$ and $S_{16}$, to determine the driving current for the TEC, steps, $S_{17}$ and $S_{18}$, to determine the bias current $I_{OP}$ for the LD region 21, and steps, $S_{19}$ and $S_{20}$, to determine the amplitude of the driving signal for the EA modulator 21. However, the process may sequentially carry those steps. As to the CP, the CP is usually controlled within the acceptable range; accordingly, when a semiconductor element shows the CP output the range, the process may decide that this semiconductor element is failure.

When the driving signal in the amplitude $V_{PP}$ thereof is varied in steps, $S_{19}$ and $S_{20}$, the output power $P_f$ resultantly shifts with a co-efficient about 0.1 dBm/0.1 $V_{PP}$. Accordingly, the process may perform steps, $S_{17}$ and $S_{18}$, after the adjustment of the amplitude $V_{PP}$ of the driving signal. The wavelength λ is substantially independent of the amplitude $V_{PP}$ of the driving signal, specifically with a co-efficient less than 1 μm/0.1V, which means that the process is unnecessary to perform steps, $S_{15}$ and $S_{16}$, again. Adjusting the ER, the CP, and the PMM within the respective ranges by iterating steps $S_{19}$ and $S_{20}$, the process obtains those conditions of the ER, the CP, and the PMM.

When all adjustments at steps $S_{15}$, $S_{17}$, and $S_{19}$, the evaluation of the BER at BtoB and after 40 km transmission will be checked at step $S_{22}$. Connecting the input of the optical receiver 69 in the setup 50 with the variable ATTs, 61 and 63, alternately, and providing the output for the optical receiver 69 to the error detector 70, the BER may be evaluated. Step $S_{23}$ calculates the transmission penalty, which is called as DP40 and defined by a difference between the BER at Back to Back and that after 40 km transmission, and decides the penalty is within the preset range or not. The acceptable range of the DP40 is, for instance, ±2 dB or further preferable ±0.75 dB.

When step $S_{23}$ decides that the transmission penalty becomes out of the preset range, which corresponds to No, the process adjusts the bias current $I_{SOA}$ accompanied with the check of the jitter again at steps, $S_{13}$ and $S_{14}$, again because the degradation of the penalty is primarily due to the increase of the BER after 40 km transmission. Because the wavelength λ shows substantially no dependence on the bias current $I_{SOA}$, which is about 1.8 μm/mA and even 20 mA change in the bias current $I_{SOA}$ causes a variation of 32 μm in the wavelength λ, step $S_{16}$ is unnecessary to be performed again. When an extreme preciseness in the wavelength λ is requested, steps, $S_{15}$ and $S_{16}$, may be carried out again. Also, the output power $P_f$ shows the dependence on the bias current $I_{SOA}$ like those shown in FIG. 3, steps, $S_{17}$ and $S_{18}$, may be performed again after the completion of step $S_{13}$. Also, the ER and the CP are substantially independent of the bias current $I_{SOA}$, but, steps, $S_{19}$ and $S_{20}$, may be carried out after the completion of step $S_{13}$. Thus, the re-adjustment of the bias current $I_{SOA}$ and some subsequent adjustments are iterated until the transmission penalty DP40 becomes within the preset range.

Then, the process evaluates at step $S_{24}$ the wavelength λ, the sub-mode suppression ration (SMSR), the monitored current Im, the operating temperature $T_{LD}$, the bias current $I_{OP}$, the driving signal in magnitude Vf thereof, the bias current $I_{SOA}$, and the voltage VSOA supplied to the SOA 23. Finally, the power meter 56 evaluates the optical power practically output from the semiconductor element 20 under TEST without interposing the optical coupler 59 and the variable ATTs, 61 and 63, by changing the switch 57. When the output power $P_f$ is out of a preset range, steps, $S_{17}$ and $S_{18}$, may be performed again.

The method thus described first determines the magnitude of the bias current $I_{SOA}$, which is fallen within the third region $A_3$ in FIG. 3, based on the eye-diagram after 40 km transmission at steps, $S_{13}$ and $S_{14}$. Then, the driving current for the TEC 12 based on the wavelength λ and the bias current $I_{OP}$ for the LD region 21 based on the optical signal output from the semiconductor element 20. Thus, the method may simplify the procedures for adjusting the driving current and the bias current $I_{OP}$, because the bias current $I_{SOA}$ dominantly affects the eye-diagram of the optical signal output from the semiconductor element 20.

The bias current $I_{SOA}$ determined by steps, $S_{13}$ and $S_{14}$, falls within the third region $A_3$ in FIG. 3, where the optical output power of the semiconductor element 20 decreases as increasing the magnitude of the bias current $I_{SOA}$. An SOA operating in the third region $A_3$ may decrease wavelength chirping, which means that the degradation in the waveform after long-range transmission may be effectively suppressed and accordingly, the transmission penalty may be also improved.

Figure 9:
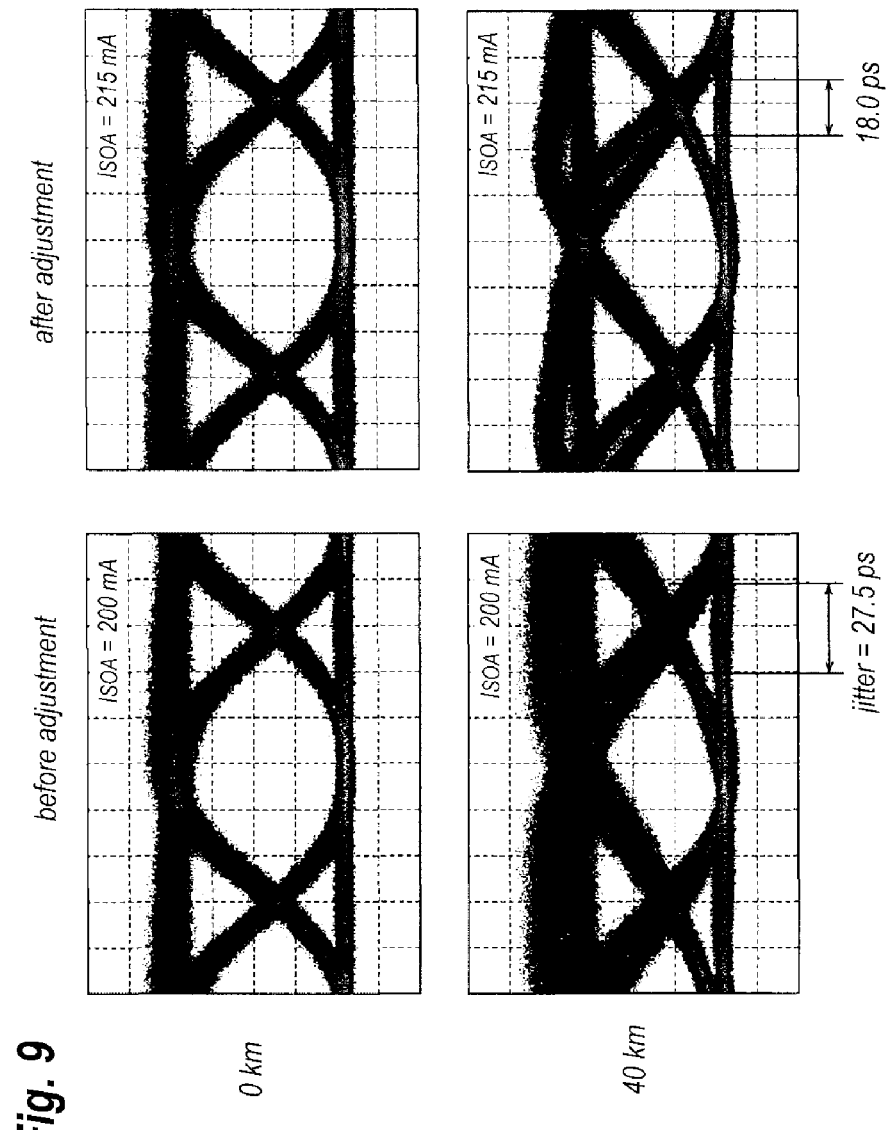
FIG. 9 compares eye-diagrams at BtoB and that after 40 km transmission before the adjustment of the bias current supplied to the SOA with those after the adjustment.

FIG. 9 compares eye-diagrams at BtoB and after 40 km transmission before the adjustment of the bias current for the SOA with that after the adjustment, where the former is 200 mA while that latter is 215 mA. The eye diagram for the bias current $I_{SOA}$ of 200 mA that is un-adjusted shows a degraded waveform after 40 km transmission with a jitter of 27.5 ps. While, after the adjustment of the bias current $I_{SOA}$ according to the present invention, the eye diagram suppressed the degradation and the jitter thereof becomes 18.0 ps.

Figure 10:
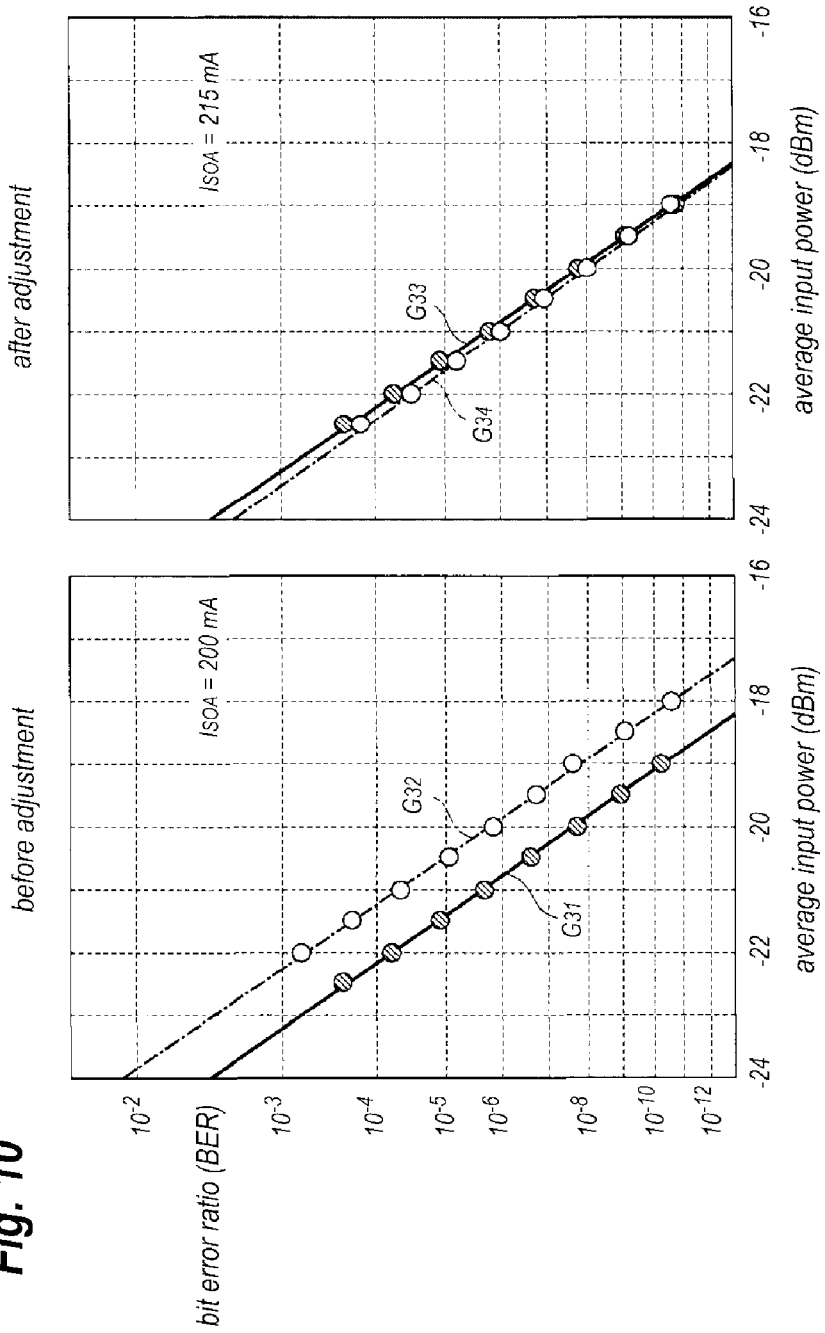
FIG. 10 compares bit error rates at BtoB and that after 40 km transmission before the adjustment of the bias current supplied to the SOA with those after the adjustment thereof.

FIG. 10 compares the bit error rates at BtoB and that after 40 km transmission before the adjustment of the bias current $I_{SOA}$, which is 200 mA, with that after the adjustment, which is 215 mA. Before the adjustment of the bias current $I_{SOA}$ shows the transmission penalty, of 0.97 dB at the BER=$10^{-3}$, which is given by a difference of the average input power. On the other hand, the transmission penalty after the adjustment becomes −0.23 dB, which means the BER improves compared with that taken at just after the output from the semiconductor element 20 and seems to be due to a negative chirp induced in the SOA 23 by the bias current $I_{SOA}$ that compensates the positive chirp of the optical fiber. In FIGS. 9 and 10, the output power $P_f$ becomes 7.59 dBm that is comparable to the target power of 7.59 dBm, and the wavelength λ also becomes within a range of ±0.01 nm.

In the semiconductor element 20, the LD region 21, the EA modulator region 22, and the SOA 23 may be monolithically integrated on the semiconductor substrate 24, which makes the semiconductor element 20 compact. Also, the LD region 21, the EA modulator region 22, and the SOA 23 are mounted on the common TEC. The present method for controlling the operating conditions of the semiconductor element 20 may be particularly adequate for such an arrangement of the LD region 21 and the SOA 23.

The adjustment of the operating conditions for the EA modulator region 22 may be carried out at steps, $S_{19}$ and $S_{20}$, after the adjustment of the bias current $I_{SOA}$ at steps, $S_{13}$ and $S_{14}$. When the adjustments for the EA modulator region 22 such as the magnitude of the driving signal $V_{PP}$, are carried out concurrently with the adjustment of the bias current $I_{OP}$; the procedures for the EA modulator 21 becomes complex. The present method may simplify the adjustment of the EA modulator 21.

The initial conditions set in step $S_{11}$ and preset ranges in steps, $S_{13}$, $S_{15}$, $S_{17}$, and $S_{19}$ are optional. Semiconductor elements 20 generally show tolerances in performance thereof depending on manufacturing processes and wafer to wafer from which a semiconductor element 20 is picked out, in particular, chirps caused by an EA modulator region 22 and an SOA strongly affect performance of a semiconductor element 20. Accordingly, operating conditions for one semiconductor element may be once determined according to the present invention, the initial conditions and the target ranges may be optionally varied depending on once determined conditions for the one semiconductor element.

The present embodiment concentrates on 40 km transmission, that is, the operating conditions of the semiconductor element 20 and the TEC 12 are determined on the degradation of the waveform of the optical signal after 40 km transmission. Another PON standard called as TWDM-PON defines specifications of 20 km transmission in addition to 40 m transmission. The present method and the procedures may be similarly applicable by changing the optical fiber 62 to another optical fiber with a distance of 20 km.

The OSA 1A thus described may be applicable to a device for an optical line terminal (OLT) provided in a center station and/or for an optical network unit (ONU) set in respective subscribers. That is, selecting a wavelength selective filter set in the WDM unit 30, the OSA 1A may be used as an OLT or an ONU.

Although the present invention has been described in considerable detail, other variations are possible. Therefore, the foregoing description of a preferred embodiment of the invention has been presented for purposes of illustration and description. It is not intended to be exhaustive or to limit the invention to the precise forms disclosed. Obviously, many modifications and variations will be apparent to persons skilled in this art. It is intended that the scope of the invention be defined by the following claims and their equivalents.

This application is based upon and claims the benefit of priority of the prior Japanese Patent Application No. 2016-210725, filed on Oct. 27, 2016.

What is claimed is:

1. A method of controlling a transmitter optical subassembly (TOSA) that outputs the optical signal and includes a semiconductor laser diode (LD), a semiconductor modulator, a semiconductor optical amplifier (SOA), and a temperature controller, the semiconductor LD generating continuous wave (CW) light responding to a first bias current, the semiconductor modulator generating modulated light by modulating the CW light responding to a driving signal, the SOA generating the optical signal by amplifying the modulated signal depending on a second bias current, the thermo-electric cooler (TEC) that mounts the semiconductor LD, the semiconductor modulator, and the SOA thereon, and controls a temperature of the semiconductor LD, the semiconductor modulator, and the SOA provided with a driving current, the method comprising steps of:

providing initial conditions to the semiconductor LD, the semiconductor modulator, the SOA, and the TEC, respectively;

adjusting the second bias current supplied to the SOA depending on a waveform of the optical signal after a transmission of a predetermined distance;

after adjusting the second bias current, adjusting the driving current for the TEC such that the optical signal has a target wavelength, adjusting the first bias current such that the optical signal shows target power, and adjusting the driving signal such that the optical signal shows a target extinction ration, a target cross point, and a target pulse mask margin (PMM);

evaluating a bit error rate (BER) just after an output of the SOA and the BER after a transmission of the predetermined distance; and adjusting the second bias current, the driving current, the first bias current, and the driving signal when the BER after the transmission of the predetermined distance shows a difference against the BER just after the output of the SOA greater than a preset range, wherein the second bias current is set in a region where the optical signal shows a negative relation against the second bias current.

2. The method of claim 1, further includes a step of, before step of adjusting the second bias current, a step of: providing initial conditions to the semiconductor LD, the semiconductor modulator, the SOA and the TEC, respectively.

3. The method of claim 1, wherein the steps of adjusting the driving current, the first bias current, and the driving signal are carried out concurrently.

4. The method of claim 1, wherein the steps of adjusting the driving current, the first bias current, and the driving signal are carried out sequentially.

5. The method of claim 1, further including a step of adjusting the second bias current again after at least one of the steps of adjusting the driving current, the first bias current, and the driving signal.

6. The method of claim 1, wherein the semiconductor LD, the semiconductor modulator, and the SOA are monolithically integrated on a semiconductor substrate.

\* \* \* \* \*